United States Patent
Sakamoto

(10) Patent No.: US 10,121,715 B2
(45) Date of Patent: Nov. 6, 2018

(54) JIG FOR FABRICATING SEMICONDUCTOR DEVICE

(71) Applicant: FUJI ELECTRIC CO., LTD., Kawasaki-shi (JP)

(72) Inventor: Yo Sakamoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 142 days.

(21) Appl. No.: 15/150,641

(22) Filed: May 10, 2016

(65) Prior Publication Data
US 2016/0372392 A1    Dec. 22, 2016

(30) Foreign Application Priority Data

Jun. 18, 2015 (JP) .................................. 2015-122775

(51) Int. Cl.
| | |
|---|---|
| H01L 23/055 | (2006.01) |
| H01L 23/00 | (2006.01) |
| H01L 23/498 | (2006.01) |
| H01L 21/52 | (2006.01) |
| H01L 25/10 | (2006.01) |
| H01L 25/00 | (2006.01) |
| H01L 23/538 | (2006.01) |
| H01L 25/07 | (2006.01) |

(52) U.S. Cl.
CPC ............ *H01L 23/055* (2013.01); *H01L 21/52* (2013.01); *H01L 23/49827* (2013.01); *H01L 23/49838* (2013.01); *H01L 23/5384* (2013.01); *H01L 23/562* (2013.01); *H01L 25/105* (2013.01); *H01L 25/50* (2013.01); *H01L 24/32* (2013.01); *H01L 24/48* (2013.01); *H01L 24/73* (2013.01); *H01L 25/072* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); *H01L 2225/1047* (2013.01); *H01L 2225/1082* (2013.01); *H01L 2924/00014* (2013.01); *H01L 2924/13055* (2013.01); *H01L 2924/14* (2013.01); *H01L 2924/15151* (2013.01)

(58) Field of Classification Search
CPC . H01L 21/52; H01L 23/055; H01L 23/49827; H01L 23/5384; H01L 25/073; H01L 2225/1082

See application file for complete search history.

(56) References Cited

U.S. PATENT DOCUMENTS

2014/0367736 A1* 12/2014 Iizuka .................. H01L 25/072 257/133

FOREIGN PATENT DOCUMENTS

JP      2001-053222 A     2/2001

* cited by examiner

*Primary Examiner* — Hoai V Pham
(74) *Attorney, Agent, or Firm* — Rabin & Berdo, P.C.

(57) ABSTRACT

A semiconductor device fabrication method, including preparing a case having a plurality of connection terminals, and fitting a jig onto the case to protect the connection terminals, tips of the connection terminals protruding from the jig. The method further includes fitting a printed circuit board on the tips of the connection terminals protruding from the jig.

6 Claims, 9 Drawing Sheets

JIG FOR FABRICATING SEMICONDUCTOR DEVICE

CROSS-REFERENCE TO RELATED APPLICATION

This application is based upon and claims the benefit of priority of the prior Japanese Patent Application No. 2015-122775, filed on Jun. 18, 2015, the entire contents of which are incorporated herein by reference.

BACKGROUND OF THE INVENTION

1. Field of the Invention

The embodiments discussed herein are related to a semiconductor device and a semiconductor device fabrication method.

2. Background of the Related Art

An inverter device for power including a plurality of semiconductor elements, such as an insulated gate bipolar transistor (IGBT) and a free wheeling diode (FWD), is widely used as one of semiconductor devices.

Semiconductor elements included in such a semiconductor device are housed in a case and are connected in parallel in an electric circuit. The case has connection terminals for control terminals electrically connected to main electrodes of the semiconductor elements. A semiconductor device is formed by soldering a printed circuit board of an external circuit onto the connection terminals (see, for example, Japanese Laid-open Patent Publication No. 2001-053222).

With the technique disclosed in, for example, the above Japanese Laid-open Patent Publication No. 2001-053222, however, a finger may touch a connection terminal or a shock may be provided to a connection terminal from the outside, depending on a way of handling the semiconductor device. In such a case, external force is exerted on the connection terminal and damages the connection terminal. For example, the connection terminal bends. As a result, a microcrack may appear inside the connection terminal. If a microcrack appears inside the connection terminal, it goes down due to vibration, shock, or thermal deformation at the time of the operation of the semiconductor device. This leads to a deterioration in the reliability of the semiconductor device.

SUMMARY OF THE INVENTION

According to an aspect, there is provided a semiconductor device including a semiconductor element, a case which houses the semiconductor element, connection terminals electrically connected to main electrodes of the semiconductor element and disposed on the case, and a jig which holds the connection terminals so as to protect the connection terminals and from which tips of the connection terminals protrude.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
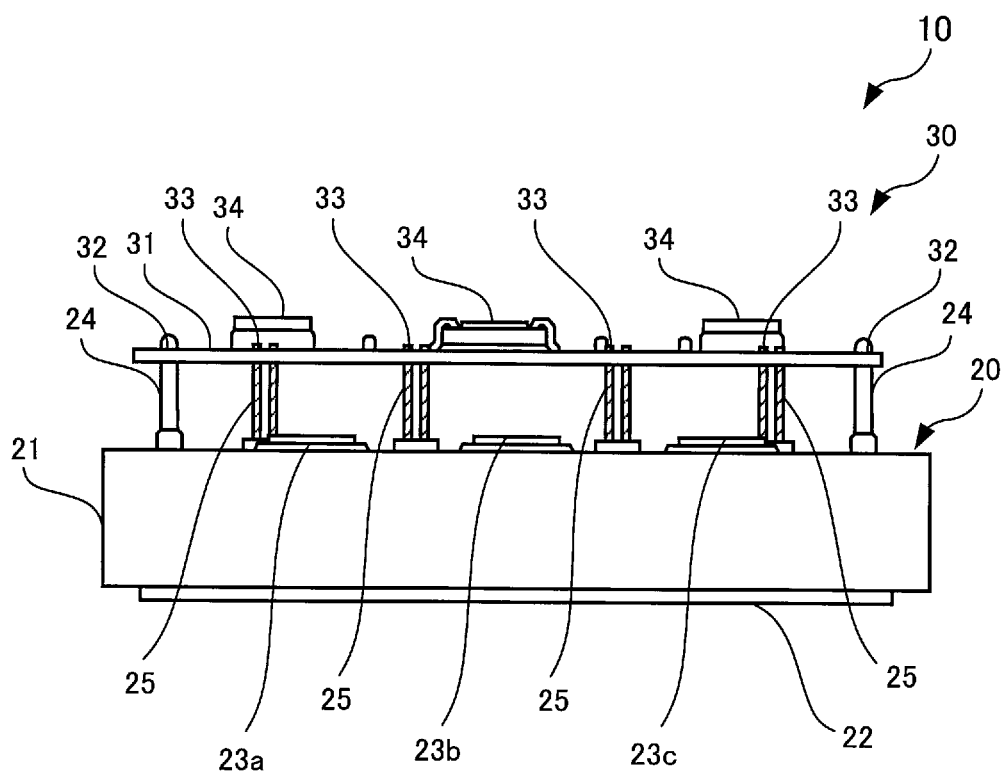
FIG. 1 is a side view of a semiconductor device according to a first embodiment.

Embodiments will now be described in detail with reference to the accompanying drawings, wherein like reference numerals refer to like elements throughout.

(First Embodiment)

First a semiconductor device according to a first embodiment will be described by the use of FIG. 1.

FIG. 1 is a side view of a semiconductor device according to a first embodiment.

A semiconductor device 10 includes a semiconductor module 20 in which a housed semiconductor element is sealed by the use of resin and a printed circuit board 30 fitted on the semiconductor module 20.

The semiconductor module 20 includes a resin case 21. A main terminal 23a, a main terminal 23b, and a main terminal 23c are formed over a principal plane of the resin case 21. The main terminal 23a is a U terminal, the main terminal 23b is an N terminal, and the main terminal 23c is a P terminal. Furthermore, the semiconductor module 20 includes guide pins 24 formed perpendicularly to the principal plane of the resin case 21 and connection terminals 25 for a gate terminal and a control terminal of a sense emitter terminal. A laminated substrate and a semiconductor element are laminated in order over a metal base 22 and are housed in the resin case 21. The laminated substrate is obtained by forming conductive plates on the upper and under surfaces of an insulating board such as a ceramic board. The above principal plane means the upper surface (front in FIG. 1) of the resin case 21. Furthermore, the metal base 22 may not be used.

The printed circuit board 30 includes an insulating substrate 31 which has a conductive plate on its principal plane (upper surface) and in which guide holes 32 and through holes 33 are made and integrated circuit (IC) chips 34 which are disposed over the principal plane of the insulating substrate 31 and on which drive circuits are formed. In FIG. 1, the IC chips 34 are disposed only on the upper surface of the printed circuit board 30. However, the IC chips 34 may also disposed on an opposite principal plane (under surface) of the printed circuit board 30 at need.

In the semiconductor device 10 the guide pins 24 of the semiconductor module 20 are inserted into the guide holes 32 of the printed circuit board 30 for alignment. Furthermore, the connection terminals 25 of the semiconductor module 20 are inserted into the through holes 33 of the printed circuit board 30 for electrical connection.

The semiconductor module 20 and the printed circuit board 30 will be described again later.

With the above semiconductor module 20, an inverter circuit is formed by, for example, an IGBT and a FWD, which are semiconductor elements, and is sealed by the use of resin. Furthermore, a high potential terminal of an external power supply is connected to the main terminal 23c which is a P terminal, and a low potential terminal of the external power supply is connected to the main terminal 23b which is an N terminal. As a result, the external power supply is electrically connected to the main terminals of the semiconductor elements. Furthermore, a load (not illustrated) is connected to the main terminal 23a which is an output terminal (U terminal). In addition, a determined control signal from an IC chip 34 of the printed circuit board 30 is applied to a semiconductor element via the connection terminal 25 of the gate terminal. By doing so, the semiconductor device 10 functions as an inverter.

A method for fabricating the above semiconductor device 10 will be described by the use of FIG. 2.

Figure 2:
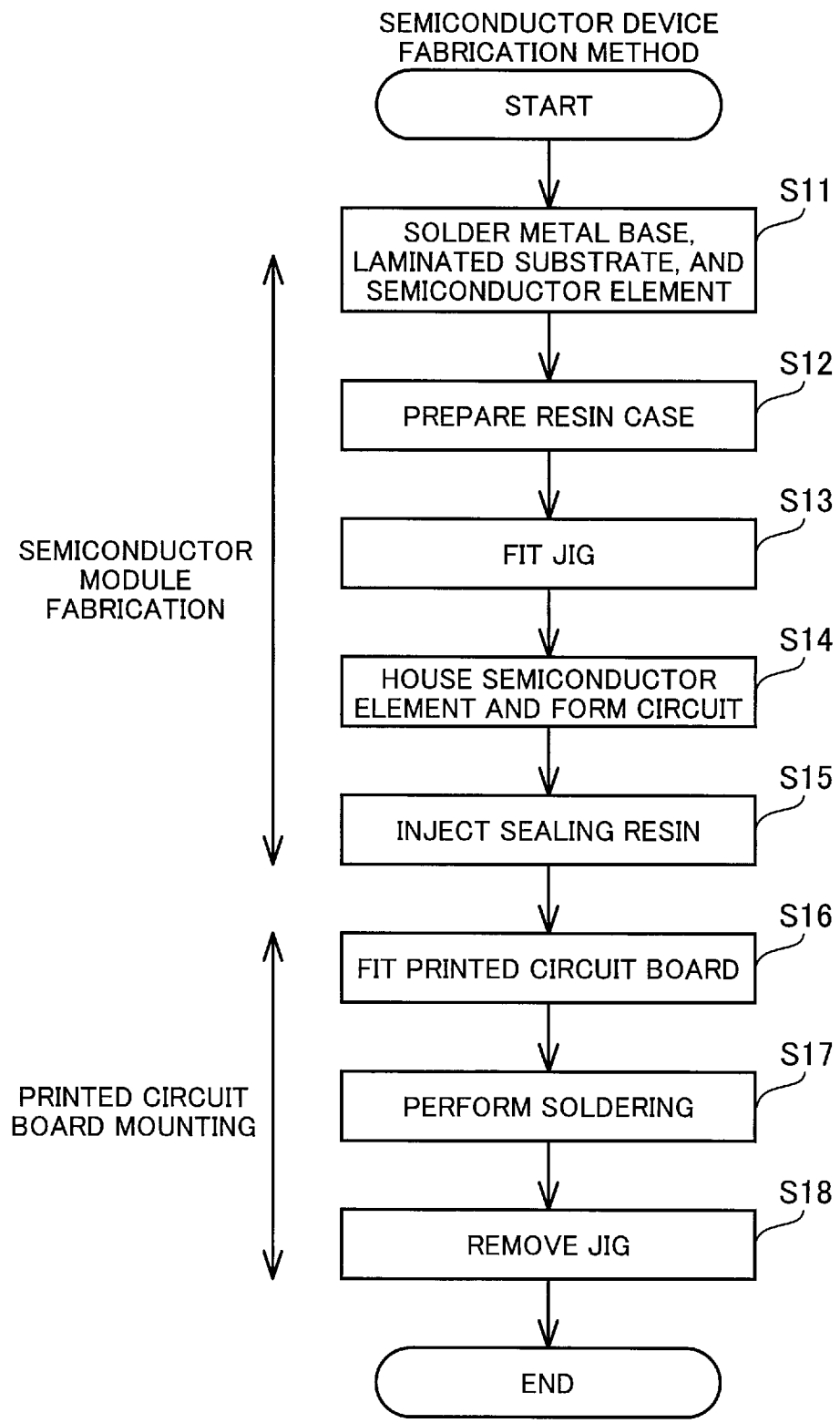
FIG. 2 is a flow chart of a method for fabricating the semiconductor device according to the first embodiment.

FIG. 2 is a flow chart of a method for fabricating the semiconductor device according to the first embodiment.

A method for fabricating the semiconductor device according to the first embodiment is divided into two processes, that is to say, a semiconductor module fabrication process from steps S11 through S15 and a printed circuit board mounting process from steps S16 through S18.

(Step S11) A laminated substrate and a semiconductor element are laminated over a metal base and each of them is joined by soldering or the like.

(Step S12) The resin case 21 insert-molded with guide pins, connection terminals, and the like by the use of resin is prepared.

The resin case 21 will be described by the use of FIGS. 3A and 3B.

Figure 3A:
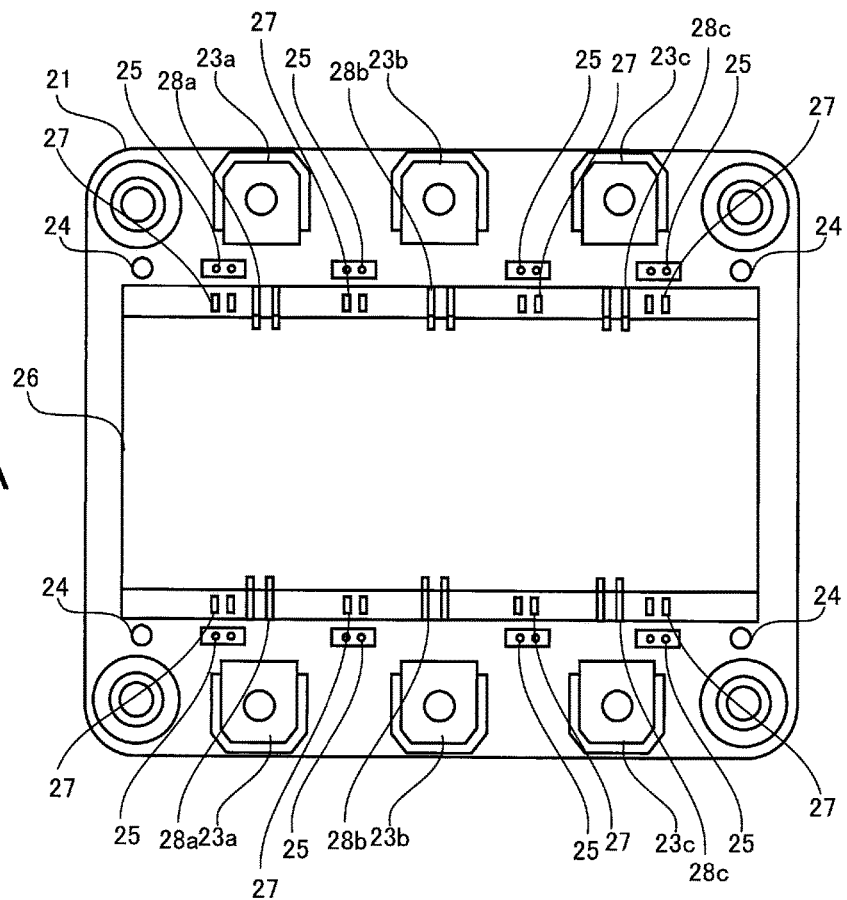
FIGS. 3A and 3B illustrate a resin case in the first embodiment.
Figure 3B:
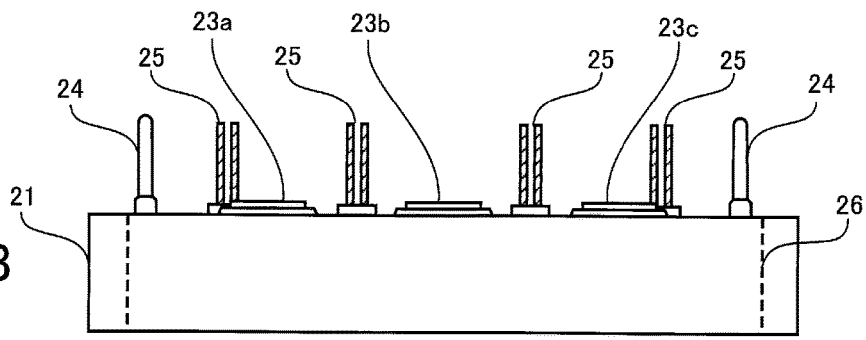

FIGS. 3A and 3B illustrate the resin case in the first embodiment.

FIG. 3A is a top view of the resin case 21. FIG. 3B is a side view of the resin case 21.

The resin case 21 has the shape of frame having an open rectangular housing area 26 in which the semiconductor element disposed over the laminated substrate over the metal base in step S11 is housed. The guide pins 24 are disposed at four corners of the housing area 26 perpendicularly to the upper surface of the resin case 21. The guide pins 24 are 5 to 10 mm in diameter and are 20 to 25 mm in length. The connection terminals 25 are disposed between the guide pins 24, which are disposed along sides in the longitudinal direction of the housing area 26, perpendicularly to the upper surface of the resin case 21. In this case, the connection terminals 25 are disposed in a line with respect to the guide pins 24. The connection terminals 25 are made of, for example, brass, are 2.5 to 3.5 mm in diameter, and are 15 to 20 mm in length. In addition, the main terminals 23a which are U terminals, the main terminals 23b which are N terminals, and the main terminals 23c which are P terminals are disposed on the upper surface of the resin case 21. Furthermore, terminals 27 electrically connected to the connection terminals 25 and terminals 28a, 28b, and 28c electrically connected to the main terminals 23a, 23b, and 23c respectively are fixed to the inside of the housing area 26. Each terminal 27 may be an exposed end portion of a connection terminal 25 whose portion is buried in the resin case 21.

(Step S13) A jig 40 is fitted on the resin case 21 prepared in step S12.

The jig 40 for protecting the connection terminals 25 will be described by the use of FIGS. 4A to 4D before fitting the jig 40 on the resin case 21 is described.

FIGS. 4A to 4D illustrate the jig used for fabricating the semiconductor device according to the first embodiment.

Figure 4A:
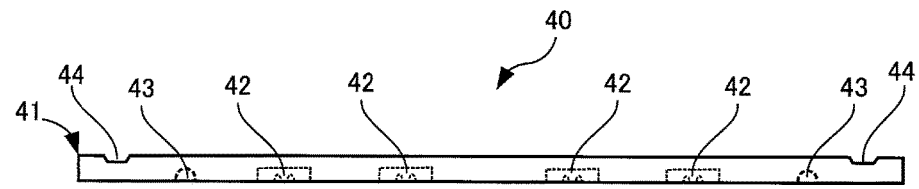
FIGS. 4A to 4D illustrate a jig used for fabricating the semiconductor device according to the first embodiment.
Figure 4C:
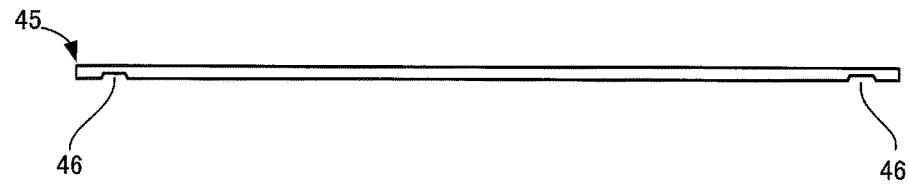
Figure 4B:
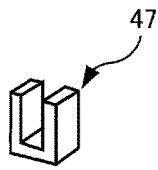
Figure 4C:
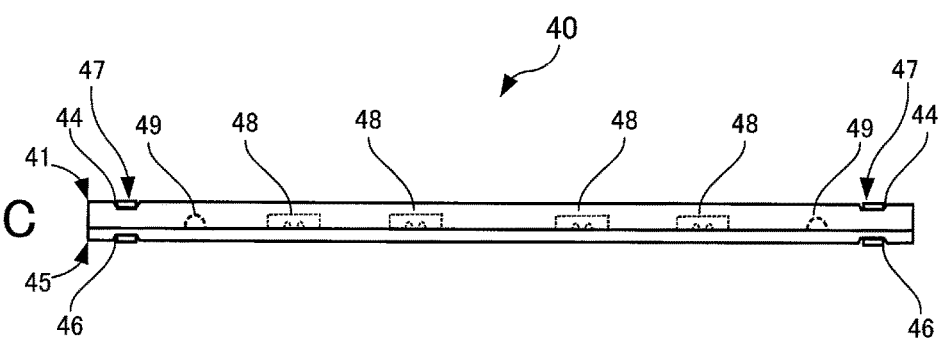
Figure 4D:
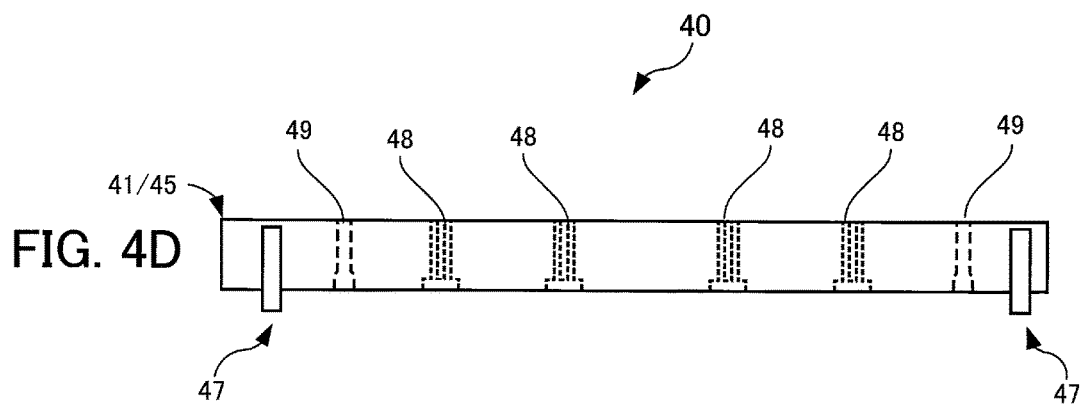

FIG. 4A is a top view of a pair of a plate portion (first plate portion, for example) 41 and a plate portion (second plate portion, for example) 45 which make up the jig 40. FIG. 4B is a perspective view of a fixing member 47 with which the plate portions 41 and 45 put together are fixed. Furthermore, FIG. 4C is a top view of the jig 40 made up of the plate portions 41 and 45 put together. FIG. 4D is a side view of the jig 40 made up of the plate portions 41 and 45 put together.

The plate portions 41 and 45 are made of a metal material, a polyphenylene sulfide (PPS) resin molding material, a polypropylene (PPT) resin molding material, a phenolic (PM) resin molding material, or the like which resists the curing temperature of sealing resin described later or solder temperature in soldering (whose heat resistant temperature is 160 to 350° C.). Furthermore, holding portions for holding the connection terminals 25 are formed in one of the plate portions 41 and 45. As illustrated in FIG. 4A, groove portions 42 and 43 are formed in one side of the plate portion 41 as examples of the holding portions. In addition, groove portions 44 are formed in the other side of the plate portion 41 and groove portions 46 are formed in one side of the plate portion 45. If the semiconductor module 20 is connected to the printed circuit board 30, the height of the plate portions 41 and 45 is smaller than the length of the connection terminals 25. That is to say, end portions of the connection terminals 25 protrude from the jig 40. If the connection terminals 25 are merely protected, the height of the plate portions 41 and 45 may be greater than the length of the connection terminals 25.

As illustrated in FIG. 4B, a section of the fixing member 47 has the shape of the letter "U". The fixing member 47 is made of the same heat-resistant material that is used for making the plate portions 41 and 45.

As illustrated in FIGS. 4C and 4D, the plate portion 41 and the plate portion 45 are put together to stop the groove portions 42 and 43 of the plate portion 41 with the plate portion 45. The fixing members 47 are fitted in the groove portions 44 and 46. By doing so, the jig 40 having protective holes 48 and positioning holes 49 is assembled. It is assumed that portions where the plate portions 41 and 45 are fixed with the fixing members 47 or the like are fixed portions. The shapes of the protective holes 48 and positioning holes 49 correspond to those of the connection terminals 25 and the guide pins 24, respectively, disposed on the resin case 21. In addition, tapers are formed at the lower entrances to the protective holes 48 and the positioning holes 49 (in FIG. 4D). The fixing members 47 may be fitted from the lower side of the plate portions 41 and 45 or be fitted from the upper side of the plate portions 41 and 45. Furthermore, the fixing members 47 may be fitted from the side of the plate portions 41 and 45.

Fitting the above jig 40 on the resin case 21 will be described by the use of FIGS. 5A and 5B.

Figure 5A:
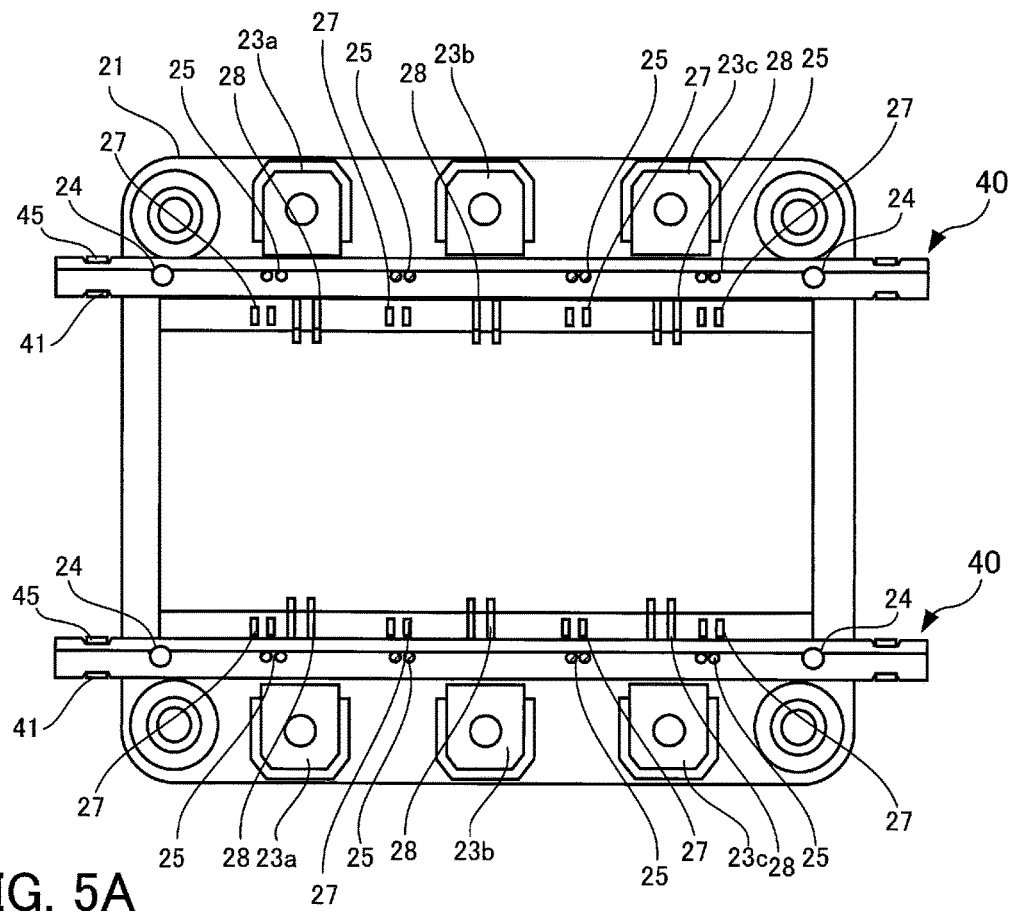
FIGS. 5A and 5B illustrate fitting the jig on the resin case in the first embodiment.
Figure 5B:
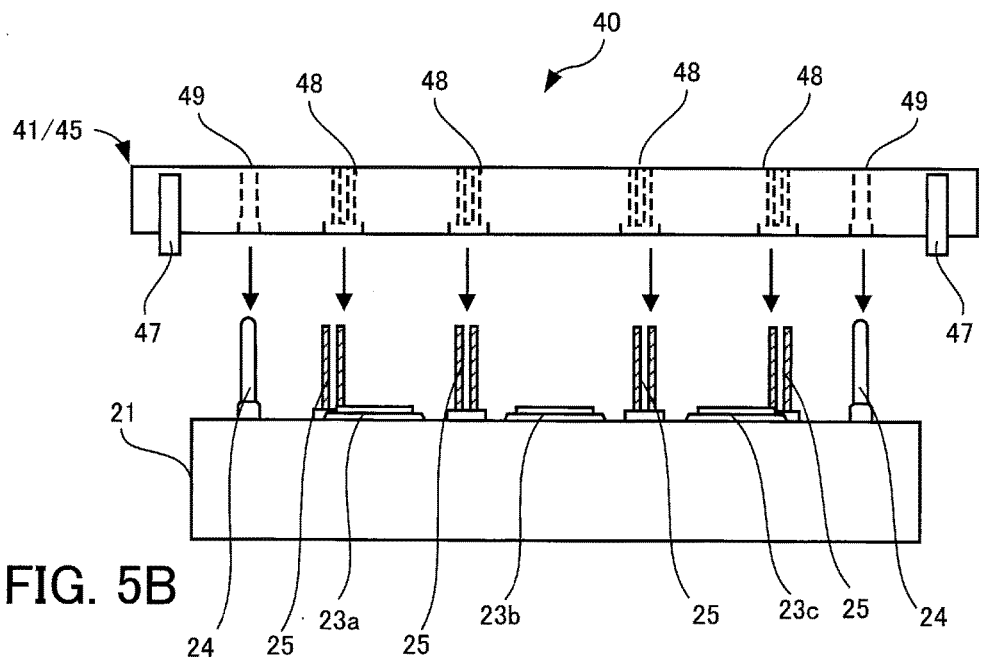

FIGS. 5A and 5B illustrate fitting the jig on the resin case in the first embodiment.

FIG. 5A is a top view which illustrates fitting the jig 40 on the resin case 21. FIG. 5B is a side view which illustrates fitting the jig 40 on the resin case 21.

As illustrated in FIGS. 5A and 5B, the jigs 40 are disposed along the pair of sides (in the longitudinal direction) of the housing area 26. The guide pins 24 of the resin case 21 are inserted into the positioning holes 49 to fix the jigs 40, and the connection terminals 25 of the resin case 21 are inserted into the protective holes 48. The jigs 40 may be inserted in this way from above the guide pins 24. Alternatively, it is desirable to hold the guide pins 24 and the connection terminals 25 by the plate portions 41 and 45 so as to surround them from the sides and to fix the plate portions 41 and 45 with the fixing members 47. This method prevents bends of the connection terminals 25 or damage to the connection terminals 25 caused at insertion time.

(Step S14) The metal base 22 over which the laminated substrate and the semiconductor element are laminated in step S11 is joined by the use of an adhesive to the housing area 26 of the resin case 21 on which the jig 40 is fitted in step S13 to house the semiconductor element.

Electrodes of the semiconductor element housed in the housing area 26 of the resin case 21 are electrically connected by wire bonding. Furthermore, the electrodes of the semiconductor element and the terminals 27, 28a, 28b, and 28c are electrically connected by the wire bonding. By doing so, a circuit is formed.

(Step S15) Resin, such as silicone gel or epoxy resin, is injected into the housing area 26 in which the semiconductor element is housed in step S14, and is heated at curing temperature corresponding to the resin. By doing so, the injected resin is solidified and the housing area 26 is sealed.

The semiconductor module 20 which is formed in this way and on which the jig 40 is fitted will be described by the use of FIGS. 6A and 6B.

Figure 6A:
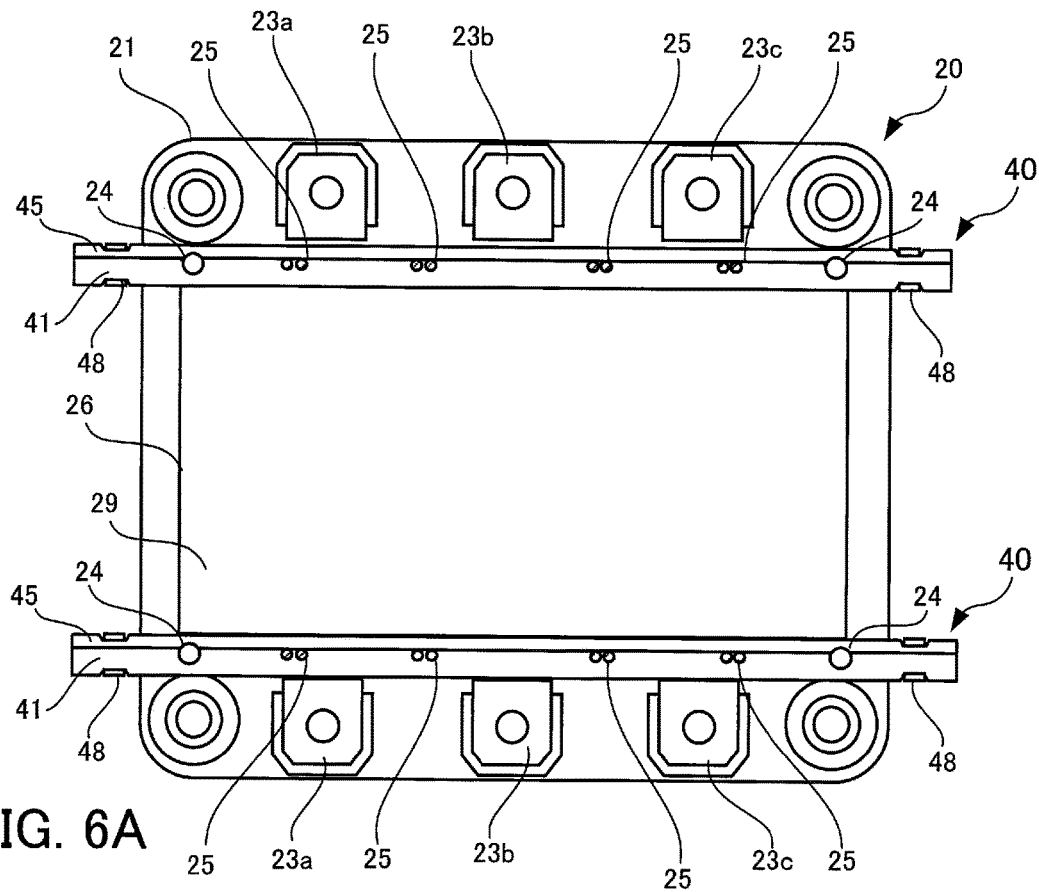
FIGS. 6A and 6B illustrate a semiconductor module on which the jig in the first embodiment is fitted.
Figure 6B:
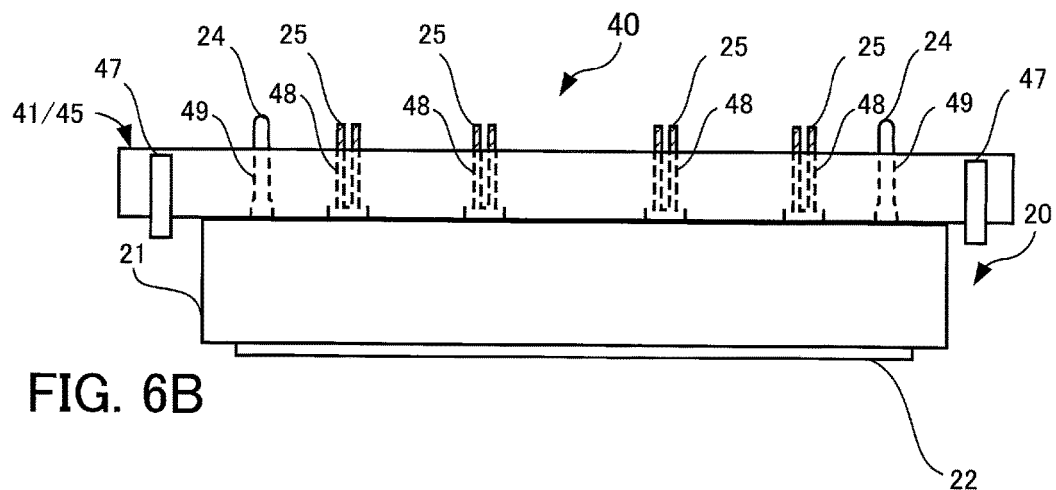

FIGS. 6A and 6B illustrate the semiconductor module on which the jig in the first embodiment is fitted.

FIG. 6A is a top view of the semiconductor module 20 on which the jig 40 is fitted. FIG. 6B is a side view of the semiconductor module 20 on which the jig 40 is fitted.

As illustrated in FIGS. 6A and 6B, the semiconductor module 20 is in a state in which the jig 40 is fitted on the resin case 21. In this state, the metal base 22 over which the laminated substrate and the semiconductor element are laminated is joined to the housing area 26, the semiconductor element is housed in the housing area 26, and the housing area 26 is sealed by the use of resin 29.

The semiconductor module 20 is fabricated through the semiconductor module fabrication process from the above steps S11 through S15.

(Step S16) The printed circuit board 30 is fitted on the semiconductor module 20 formed in step S15.

The printed circuit board 30 will now be described by the use of FIGS. 7A and 7B.

Figure 7A:
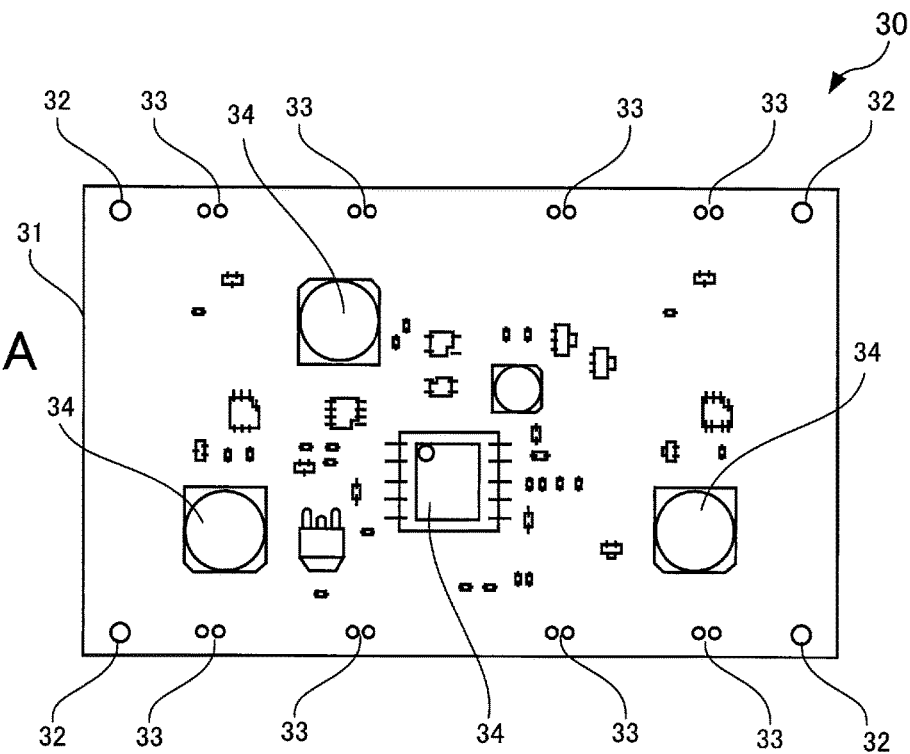
FIGS. 7A and 7B illustrate a printed circuit board in the first embodiment.
Figure 7B:
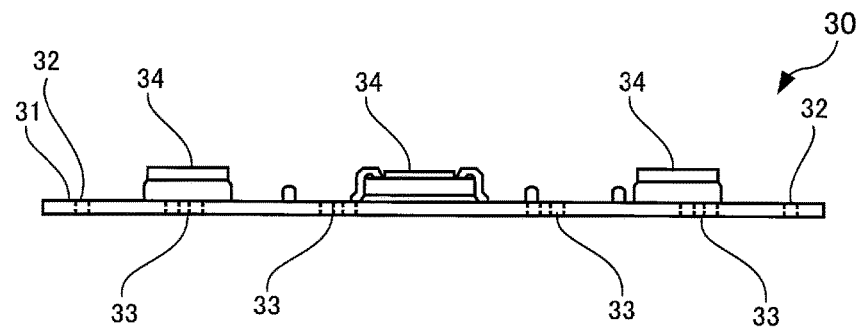

FIGS. 7A and 7B illustrate the printed circuit board in the first embodiment.

FIG. 7A is a top view of the printed circuit board 30. FIG. 7B is a side view of the printed circuit board 30.

With the printed circuit board 30 the insulating substrate 31 on which the conductive plate (not illustrated) is formed has the guide holes 32 at its four corners and the through holes 33 made between the guide holes 32 along opposite sides (in the longitudinal direction) of the insulating substrate 31 and electrically connected to the conductive plate. The through holes 33 are acceptance portions. As described later, the through holes 33 accept the connection terminals 25. By doing so, the connection terminals 25 are fitted. Furthermore, the IC chips 34 electrically connected to the conductive plate are disposed over the insulating substrate 31 of the printed circuit board 30. The conductive plate is made of copper or the like.

Furthermore, fitting the above printed circuit board 30 on the semiconductor module 20 will be described by the use of FIGS. 8A and 8B.

Figure 8A:
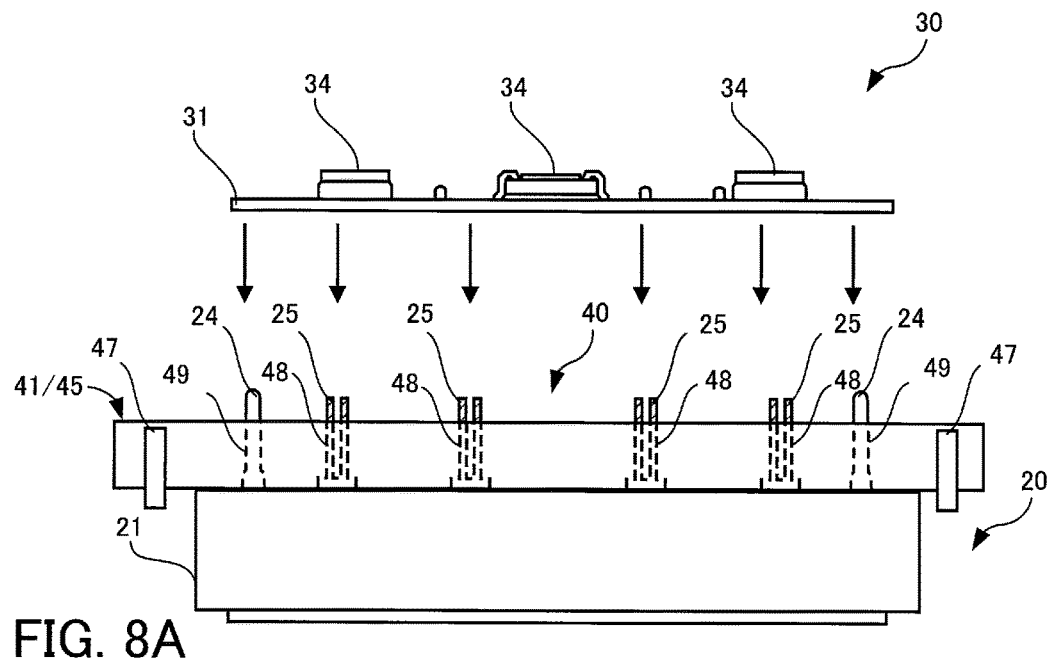
FIGS. 8A and 8B illustrate fitting the printed circuit board on the semiconductor module on which the jig in the first embodiment is fitted.
Figure 8B:
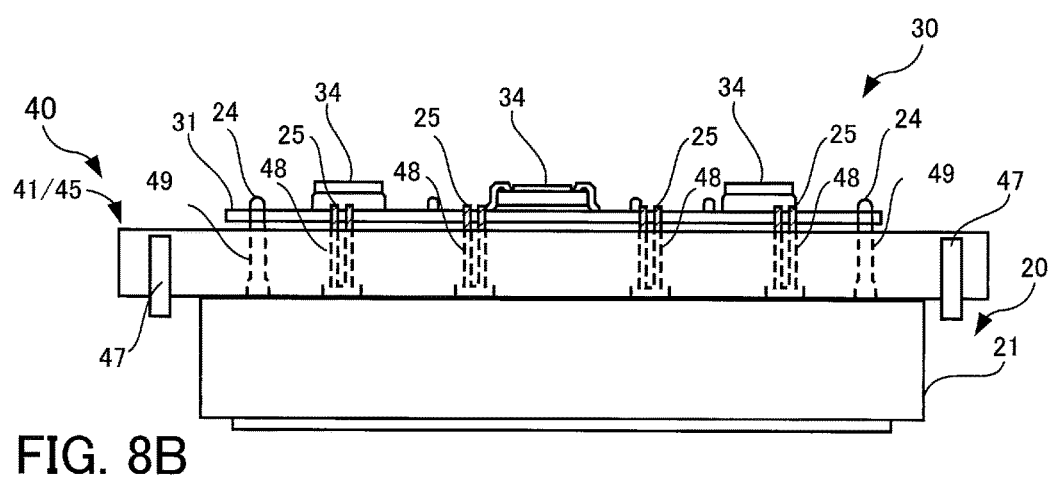

FIGS. 8A and 8B illustrate fitting the printed circuit board on the semiconductor module on which the jig in the first embodiment is fitted.

FIG. 8A is a side view which illustrates a state at the time of fitting the printed circuit board 30 on the semiconductor module 20. FIG. 8B is a side view which illustrates a state after fitting the printed circuit board 30 on the semiconductor module 20.

As illustrated in FIGS. 8A and 8B, the guide pins 24 and the connection terminals 25 of the semiconductor module 20 are inserted into the guide holes 32 and the through holes 33, respectively, of the printed circuit board 30 to fit the printed circuit board 30 on the semiconductor module 20. The through holes 33 of the printed circuit board 30 are fitted in this way on protrusions of the connection terminals 25. The protrusions are end portions of the connection terminals 25 which protrude from the jig 40 after fitting the jig 40.

The printed circuit board 30 is fitted in this way on the semiconductor module 20 through the jig 40.

FIGS. 8A and 8B illustrate a case where the fixing members 47 are fitted from the lower side of the plate portions 41 and 45. However, the fixing members 47 may be fitted from the upper side of the plate portions 41 and 45 or be fitted from the side of the plate portions 41 and 45.

(Step S17) The connection terminals 25 which protrude from the through holes 33 of the printed circuit board 30 fitted on the semiconductor module 20 and the through holes 33 are soldered by the use of solder heated to a determined solder temperature.

(Step S18) The fixing members 47 are removed from the jig 40, the plate portions 41 and 45 are separated, and the jig 40 is removed from the semiconductor module 20 on which the printed circuit board 30 is fitted. It does not matter if the jig 40 is not removed from the semiconductor module 20 on which the printed circuit board 30 is fitted. In this case, the rigidity of the semiconductor module 20 on which the printed circuit board 30 is fitted is improved.

The semiconductor device 10 illustrated in FIG. 1 is obtained through the printed circuit board mounting process from the above steps S16 through S18.

As has been described, the semiconductor device 10 (semiconductor module 20) fabricated by the semiconductor module fabrication process (steps S11 through S15) includes the resin case 21 having the guide pins 24 disposed perpendicularly to the upper surface of the resin case 21 on peripheral edge portions of the housing area 26 in which the semiconductor element is housed and the connection terminals 25 disposed perpendicularly to the upper surface of the resin case 21 on the peripheral edge portions. Furthermore, the jig 40 having the positioning holes 49 into which the guide pins 24 are inserted and the protective holes 48 into which the connection terminals 25 are inserted is fitted on the resin case 21. By doing so, the connection terminals 25 are protected by the jig 40 fixed by aligning two portions, that is to say, one end portion and the other end portion of the jig 40 with the resin case 21 by the guide pins 24. As a result, when the resin case 21 is handled in, for example, the semiconductor module fabrication process from step S13 on, direct contact with the connection terminals 25 or an external impact on the connection terminals 25 is prevented. This prevents damage to the connection terminals 25. In particular, there is a case where the semiconductor module fabrication process (steps S11 through S15) and the printed circuit board mounting process (steps S16 through S18) are performed in different places. In this case, there is need to pack the semiconductor module 20 fabricated in the semiconductor module fabrication process and to convey it to the place where the printed circuit board mounting process is performed. Even in this situation the connection terminals 25 are protected by the jig 40. This prevents direct contact with the connection terminals 25 or impact on the connection terminals 25 at packing time or conveyance time. Accordingly, damage to the connection terminals 25 is prevented. The resin case 21 may not have the guide pins 24 and may have only the connection terminals 25. In this case, the jig 40 is fitted on the connection terminals 25.

Furthermore, with the semiconductor module 20 the jig 40 is fitted in this way. Accordingly, alignment between the jig 40 and the resin case 21 is performed. At this time the connection terminals 25 do not bend. As a result, when the printed circuit board 30 is fitted on the semiconductor module 20, the jig 40 guides the guide pins 24 and the connection terminals 25 to smoothly insert the guide pins 24 and the connection terminals 25 into the guide holes 32 and the through holes 33, respectively, of the printed circuit board 30. Therefore, when the printed circuit board 30 is fitted on the semiconductor module 20, there is no need to perform alignment or the like with fingers for making it easy to insert the connection terminals 25 into the through holes 33. Because direct contact with the connection terminals 25 is not made, damage to the connection terminals 25 is prevented.

In addition, by fitting the jig 40, a certain distance is maintained between the upper surface of the semiconductor module 20 and the printed circuit board 30.

Because the connection terminals 25 are protected by the jig 40, damage to the connection terminals 25 is prevented. This prevents deterioration in the reliability of the semiconductor device 10.

In the first embodiment a case where the connection terminals 25 of the resin case 21 are inserted into the through holes 33 of the printed circuit board 30 is described as an example. However, another case is possible. If socket connectors are applied to the printed circuit board 30, the jig 40 can also be used as in the first embodiment.

In addition, the jig 40 may be used in a fabrication method other than the above fabrication method. For example, as in step S11, a laminated substrate and a semiconductor element are laminated over a metal base and each of them is joined by soldering or the like. Next, guide pins, connection terminals, the metal base over which the laminated substrate and the semiconductor element are laminated in step S11, and the like are placed in a metal mold. Electrodes of the semiconductor element are electrically connected by wire bonding. Furthermore, the electrodes of the semiconductor element and terminals 27, 28a, 28b, and 28c are electrically connected by the wire bonding. By doing so, a circuit is formed. Insert molding is then performed by the use of resin to integrally mold a semiconductor module 20. After that, the jig 40 is fitted in the same way as with step S13 on connection terminals 25 and the like of the semiconductor module 20 integrally molded in this way (FIGS. 6A and 6B). In addition, steps S16 and S17 are performed and a semiconductor device 10 including the jig 40 (FIGS. 8A and 8B) is delivered to a manufacturer or the like. When the semiconductor device 10 including the jig 40 is delivered to the manufacturer or the like, the semiconductor device 10 is packed and is conveyed to the manufacturer or the like. Even in this situation the connection terminals 25 are protected by the jig 40 in the semiconductor device 10 including the jig 40. This prevents direct contact with the connection terminals 25 or impact on the connection terminals 25 at packing time or conveyance time. Accordingly, damage to the connection terminals 25 is prevented. Furthermore, after the semiconductor device 10 including the jig 40 is delivered to the manufacturer or the like, a step which is the same as step S18 is performed to remove the jig 40.

Accordingly, even in this case, the connection terminals 25 are protected by the jig 40. This prevents damage to the connection terminals 25 and therefore prevents deterioration in the reliability of the semiconductor device 10.

(Second Embodiment)

In a second embodiment three kinds of jigs other than the jig in the first embodiment will be described by the use of FIGS. 9A to 9E.

FIGS. 9A to 9E illustrate jigs in a second embodiment.

Figure 9A:
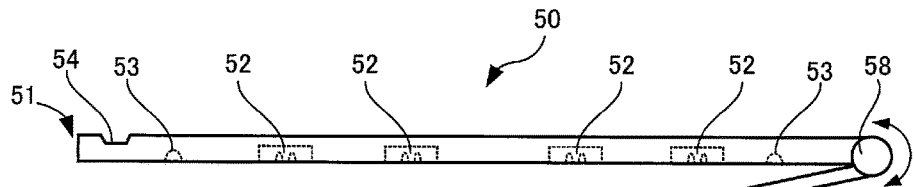
FIGS. 9A to 9E illustrate jigs in a second embodiment.
Figure 9B:
Figure 9C:
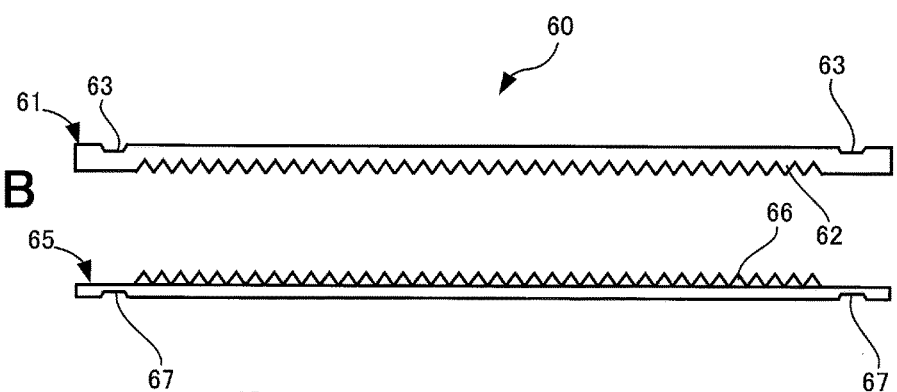
Figure 9D:
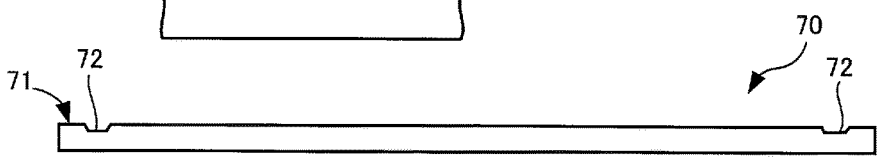
Figure 9E:
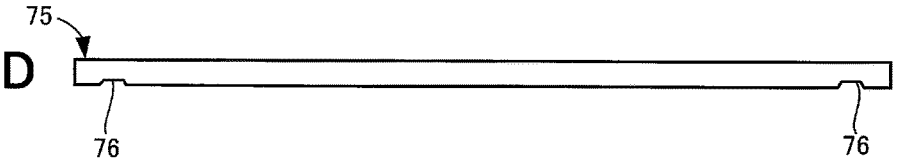

FIG. 9A is a top view of a jig (first jig) other than the jig in the first embodiment. FIG. 9B is a top view of a jig (second jig) other than the jig in the first embodiment. FIG. 9C is an enlarged fragmentary top view of the jig (second jig) other than the jig in the first embodiment. Furthermore, FIG. 9D is a top view of a jig (third jig) other than the jig in the first embodiment. FIG. 9E is an enlarged fragmentary top view of the jig (third jig) other than the jig in the first embodiment.

A jig 50 illustrated in FIG. 9A includes plate portions 51 and 55. Groove portions 52 and 53 which are the same as the groove portions 42 and 43, respectively, of the plate portion 41 of the jig 40 in the first embodiment are formed in the plate portion 51. Furthermore, a groove portion 54 is formed in one end portion of the plate portion 51 of the jig 50 and a groove portion 56 is formed in one end portion of the plate portion 55 of the jig 50. A fixing member 47 is fitted in the groove portions 54 and 56. This is the same with the first embodiment. On the other hand, the other end portion of the plate portion 51 and the other end portion of the plate portion 55 are connected by a hinge 58. That is to say, the hinge 58 is one of fixed portions. The plate portions 51 and 55 can be opened or closed with the hinge 58 as an axis. With the jig 50, the plate portions 51 and 55 are closed with the hinge 58 as an axis so that they will be put together. The fixing member 47 is fitted in the groove portions 54 and 56. By doing so, positioning holes and protective holes are formed. This is the same with the jig 40 in the first embodiment. The above jig 50 is fitted on the semiconductor module 20 by inserting the guide pins 24 and the connection terminals 25 of the semiconductor module 20 into the positioning holes and the protective holes respectively. This is the same with the jig 40 in the first embodiment. Furthermore, after the printed circuit board 30 is fitted on the semiconductor module 20, the fixing member 47 is removed from the jig 50 and the plate portions 51 and 55 are opened with the hinge 58 as an axis. By doing so, the jig 50 is removed from the semiconductor module 20 (semiconductor device 10).

Because the other end portion of the plate portion 51 and the other end portion of the plate portion 55 are connected by the hinge 58, the jig 50 is removed from the semiconductor device 10 by removing the fixing member 47 fitted in the groove portions 54 and 56 and opening the one end portion of the plate portion 51 and the one end portion of the plate portion 55. The jig 50 is removed from the semiconductor device 10 in a state in which the other end portion of the plate portion 51 and the other end portion of the plate portion 55 are connected by the hinge 58. The jig 50 does not completely separate into the two plate portions. As a result, it is easy to handle the jig 50.

Next, a jig 60 illustrated in FIG. 9B includes plate portions 61 and 65. Groove portions 63 and 67 are formed in surfaces opposite facing surfaces of the plate portions 61 and 65 respectively. In addition, groove portions 62 and 66 are formed in the facing surfaces of the plate portions 61 and 65 respectively. That is to say, irregularities (whose sections have the shape of a mountain) are formed in the facing surfaces of the plate portions 61 and 65. As illustrated in FIG. 9C, the guide pins 24 and the connection terminals 25 of the resin case 21 are put between concavities (or convexities) of the groove portions 62 of the plate portion 61 and convexities (or concavities) of the groove portions 66 of the plate portion 65 and fixing members 47 are fitted in the groove portions 63 and 67. By doing so, the jig 60 is fitted on the resin case 21. Furthermore, after the printed circuit board 30 is fitted on the semiconductor module 20, the fixing members 47 are removed from the jig 60 and the plate portions 61 and 65 are separated. By doing so, the jig 60 is removed from the semiconductor module 20 (semiconductor device 10). Moreover, it is desirable that the distance between the convexities of the plate portion 61 and the convexities of the plate portion 65 at the time of putting together the plate portions 61 and 65 of the jig 60 be greater than the diameter of the connection terminals 25.

With the jig 60 the guide pins 24 and the connection terminals 25 are put between the irregularities of the groove portions 62 and 66 of the plate portions 61 and 65. Accordingly, in particular, the perpendicularity of the connection terminals 25 disposed perpendicularly to the upper surface of the resin case 21 is maintained. Furthermore, it is possible to fix the connection terminals 25 by means of the irregularities of the groove portions 62 and 66 of the plate portions 61 and 65 without forming groove portions at positions corresponding to the connection terminals 25. Therefore, the jig 60 is applicable to resin cases 21 of various types.

Next, a jig 70 illustrated in FIG. 9D includes plate portions 71 and 75. Groove portions 72 and 76 are formed in surfaces opposite facing surfaces of the plate portions 71 and 75 respectively. Furthermore, the plate portions 71 and 75 are made of an elastic body, such as silicone rubber or urethane rubber, which resists the curing temperature of sealing resin or solder temperature in soldering. For example, the Shore hardness of these elastic bodies is greater than or equal to about 20 and smaller than or equal to about 90. Preferably, the Shore hardness of these elastic bodies is greater than or equal to about 30 and smaller than or equal to about 90. If an elastic body is too soft, then it has low durability and it is impossible to adequately hold the connection terminals 25. Furthermore, if an elastic body is too hard, then elastic deformation is insufficient and it is impossible to hold the connection terminals 25. The Shore hardness is a value indicative of the hardness of an elastic body and is obtained by pushing a penetrator (pressing or an indenter) into the surface of an object to be measured (elastic body) to deform the penetrator, measuring a deformation amount (push-in depth) of the penetrator, and converting the deformation amount into a numerical value. The Shore hardness is measured by the use of a type A durometer (spring-type rubber hardness meter) on the basis of JIS K6253-3 "Rubber, vulcanized or thermoplastic—Determination of hardness—Part 3: Durometer method".

As illustrated in FIG. 9E, the guide pins 24 and the connection terminals 25 of the resin case 21 are put between the plate portions 71 and 75 made of an elastic body and the elastic body functions as holding portions. Fixing members 47 are fitted in the groove portions 72 and 76. By doing so, the jig 70 is fitted on the resin case 21. Furthermore, after the printed circuit board 30 is fitted on the semiconductor module 20, the fixing members 47 are removed from the jig 70 and the plate portions 71 and 75 are separated. By doing so, the jig 70 is removed from the semiconductor module 20 (semiconductor device 10).

The guide pins 24 and the connection terminals 25 are not always disposed in a line. That is to say, the disposition of the guide pins 24 may be shifted from the disposition of the connection terminals 25, for example, in an upward or downward direction in FIG. 9E. Even in such a case, the connection terminals 25 are reliably put between the plate portions 71 and 75 of the jig 70 for protection. In addition, with the jig 70 it is possible to fix the connection terminals 25 without forming groove portions at positions corresponding to the connection terminals 25. Therefore, the jig 70 is applicable to resin cases 21 of various types.

Even if the above jig 50, 60, or 70 in the second embodiment is fitted on the resin case 21 in place of the jig 40 in the first embodiment, the same effect that is obtained in the first embodiment is achieved.

The jig 60 or 70 is divided in the above way. However, one end portion of one plate portion and one end portion of the other plate portion may be connected by a hinge. In this case, the other end portions can be opened or closed. This is the same with the jig 50.

According to the semiconductor device having the above structure and the semiconductor device fabrication method, damage to connection terminals is prevented and therefore deterioration in the reliability of a semiconductor device is prevented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A jig for fabricating a semiconductor device that includes
    a case housing a semiconductor element, and
    connection terminals, formed on the case, that are electrically connected to main electrodes of the semiconductor element,
the jig comprising:
    a first plate portion and a second plate portion, one of the first and second plate portions having a plurality of holding portions formed therein, and
    a fixing portion fixing the first and second plate portions, so that the connection terminals are held in and protected by the holding portions, tips of the connection terminals being protrusible from the jig.
2. The jig according to claim 1, wherein the holding portions are grooves.
3. The jig according to claim 1, wherein the holding portions are elastic members.
4. The jig according to claim 1, wherein
    the semiconductor device further includes a printed circuit board having a plurality of acceptance portions, and
    the holding portion has a height above which the tips of the connection terminals protruding from the jig are fitted in the acceptance portions.
5. A semiconductor device, comprising
    a case housing a semiconductor element that has a plurality of main electrodes;

a plurality of connection terminals, formed on the case and electrically connected to the main electrodes of the semiconductor element;

a printed circuit board electrically connected to the connection terminals, the printed circuit board being formed using a jig that holds the connection terminals and being thus formed on tips of the connection terminals protruding from the jig; and a plurality of guide pins disposed on peripheral edge portions of the case.

6. The semiconductor device according to claim 5, wherein the connection terminals are disposed in a line with the guide pins.

* * * * *